(12) United States Patent
Huang

(10) Patent No.: US 8,736,290 B2
(45) Date of Patent: *May 27, 2014

(54) SIGNAL DETECTION APPARATUS FOR SAS DEVICES

(75) Inventor: Fa-Sheng Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 296 days.

This patent is subject to a terminal disclaimer.

(21) Appl. No.: 13/110,985

(22) Filed: May 19, 2011

(65) Prior Publication Data

US 2012/0268104 A1 Oct. 25, 2012

(30) Foreign Application Priority Data

Apr. 22, 2011 (CN) .......................... 2011 1 0101742

(51) Int. Cl.
*G01R 31/00* (2006.01)
*G01R 1/02* (2006.01)
*G01R 1/04* (2006.01)
*H01R 9/00* (2006.01)
*H05K 1/00* (2006.01)

(52) U.S. Cl.
CPC .. *G01R 1/02* (2013.01); *G01R 1/04* (2013.01); *H01R 9/00* (2013.01); *H05K 1/00* (2013.01)
USPC .............. 324/750.3; 324/76.12; 324/756.04; 324/756.07; 324/762.01; 324/762.1; 439/581; 439/638; 439/502; 439/79; 439/541.5; 361/785; 361/789; 174/17.08; 174/359; 174/50; 174/51; 174/53

(58) Field of Classification Search
CPC .............. G01R 1/02; G01R 1/04; H01R 9/00; H05K 1/00
USPC ........................... 324/76.12, 756.04–756.07, 324/762.01–762.1; 439/581, 638, 502, 79, 439/541.5; 361/785, 789; 174/17.08, 359, 174/50–53, 145, 59
See application file for complete search history.

(56) References Cited

U.S. PATENT DOCUMENTS 2,012 A * 3/1841 Burger ............................ 83/754
5,272,664 A * 12/1993 Alexander et al. .............. 365/52

(Continued)

OTHER PUBLICATIONS

Wang et al., "An Ethernet Based Data Storage Protocol for Home Network", IEEE Transactions on Consumer Electronics, May 2004, p. 543-551.*

(Continued)

*Primary Examiner* — Patrick Assouad
*Assistant Examiner* — Lamarr Brown
(74) *Attorney, Agent, or Firm* — Novak Druce Connolly Bove + Quigg LLP

(57) ABSTRACT

A signal detection apparatus for a serial attached SCSI (SAS) device includes an SAS female connector to be connected to a SAS device, an SAS male connector to be connected to a system, and first to fourth pairs of subminiature version A (SMA) connectors. When the first pair of SMA connectors is connected to an oscillograph to detect a pair of output signals from the SAS device, the second and third pairs of SMA connectors connect the SAS device with the system. When the second pair of SMA connector is connected to the oscillograph to detect another pair of output signals from the SAS device, the first and fourth pairs of SMA connectors connect the SAS device with the system.

2 Claims, 2 Drawing Sheets

(56) References Cited

U.S. PATENT DOCUMENTS

| | | | |
|---|---|---|---|
| 7,046,788 B2* | 5/2006 | Schmechel et al. | 379/221.08 |
| 7,490,176 B2* | 2/2009 | Lee | 710/17 |
| 7,913,134 B2* | 3/2011 | Kim | 714/727 |
| 7,971,110 B2* | 6/2011 | Tang | 714/716 |
| 7,979,232 B2* | 7/2011 | Einsweiler et al. | 702/108 |
| 8,140,667 B2* | 3/2012 | Keyghobad et al. | 709/224 |
| 8,314,629 B2* | 11/2012 | Huang | 324/756.02 |
| 2003/0109177 A1* | 6/2003 | Meredith | 439/608 |
| 2004/0032249 A1* | 2/2004 | Kuno | 324/158.1 |
| 2006/0085701 A1* | 4/2006 | Agrawal et al. | 714/718 |
| 2006/0139854 A1* | 6/2006 | Beyers et al. | 361/600 |
| 2006/0189182 A1* | 8/2006 | Higeta et al. | 439/79 |
| 2007/0218725 A1* | 9/2007 | Liao et al. | 439/157 |
| 2008/0003845 A1* | 1/2008 | Hong et al. | 439/67 |
| 2008/0007282 A1* | 1/2008 | Hasegawa et al. | 324/757 |
| 2008/0201512 A1* | 8/2008 | Lee | 710/300 |
| 2008/0307170 A1* | 12/2008 | Lee | 711/149 |
| 2009/0113257 A1* | 4/2009 | He et al. | 714/714 |
| 2009/0168654 A1* | 7/2009 | Mies et al. | 370/241 |
| 2010/0220441 A1* | 9/2010 | Berlekamp | 361/679.54 |
| 2011/0107002 A1* | 5/2011 | Jones et al. | 710/312 |
| 2011/0291689 A1* | 12/2011 | Huang | 324/756.04 |
| 2012/0268104 A1* | 10/2012 | Huang | 324/76.12 |
| 2012/0290762 A1* | 11/2012 | Kabra et al. | 710/305 |
| 2013/0043883 A1* | 2/2013 | Li et al. | 324/600 |
| 2013/0234742 A1* | 9/2013 | Huang | 324/750.01 |

OTHER PUBLICATIONS

Dattaprasad et al., "Signal Integrity Factors in High Speed Multi-Board Test Setup", 2013 13th International Symposium on Communications and Information Technlogies (ISCIT), Sep. 2013, p. 276-281.*

* cited by examiner

SIGNAL DETECTION APPARATUS FOR SAS DEVICES

BACKGROUND

1. Technical Field

The present disclosure relates to signal detection apparatuses, and particularly, to a signal detection apparatus for detecting output signals from a serial attached Small Computer System Interface (SCSI) of an electronic device.

2. Description of Related Art

Nowadays, many electronic devices include a serial attached SCSI (SAS), such as for connecting to SAS hard disk drives (HDDs). A system, such as a server, may use a number of SAS HDDs to save data. After manufacturing but before shipping, the system needs to be tested. One test is to detect output signals from the SAS HDDs. A common method is to use a probe of an oscillograph to contact the signal output pins of the SAS HDDs. However, the test result of this method may be inaccurate.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing in which like references indicate similar elements, is illustrated by way of example and not by way of limitation. It should be noted that references to "an" or "one" embodiment in this disclosure are not necessarily to the same embodiment, and such references mean at least one.

Figure 1:
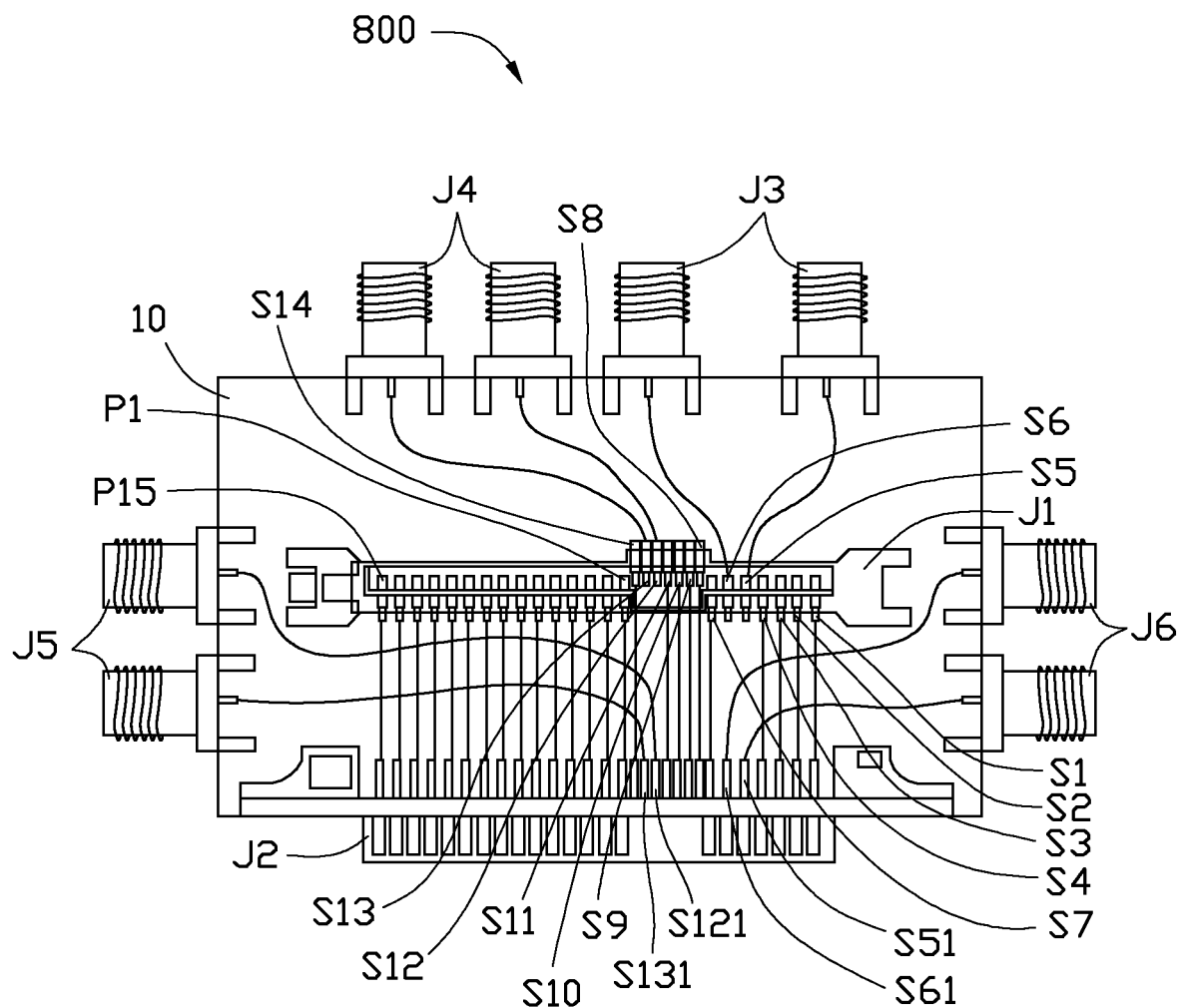
FIG. 1 is a schematic view of an embodiment of a signal detection apparatus for serial attached SCSI (SAS) devices.
Figure 2:
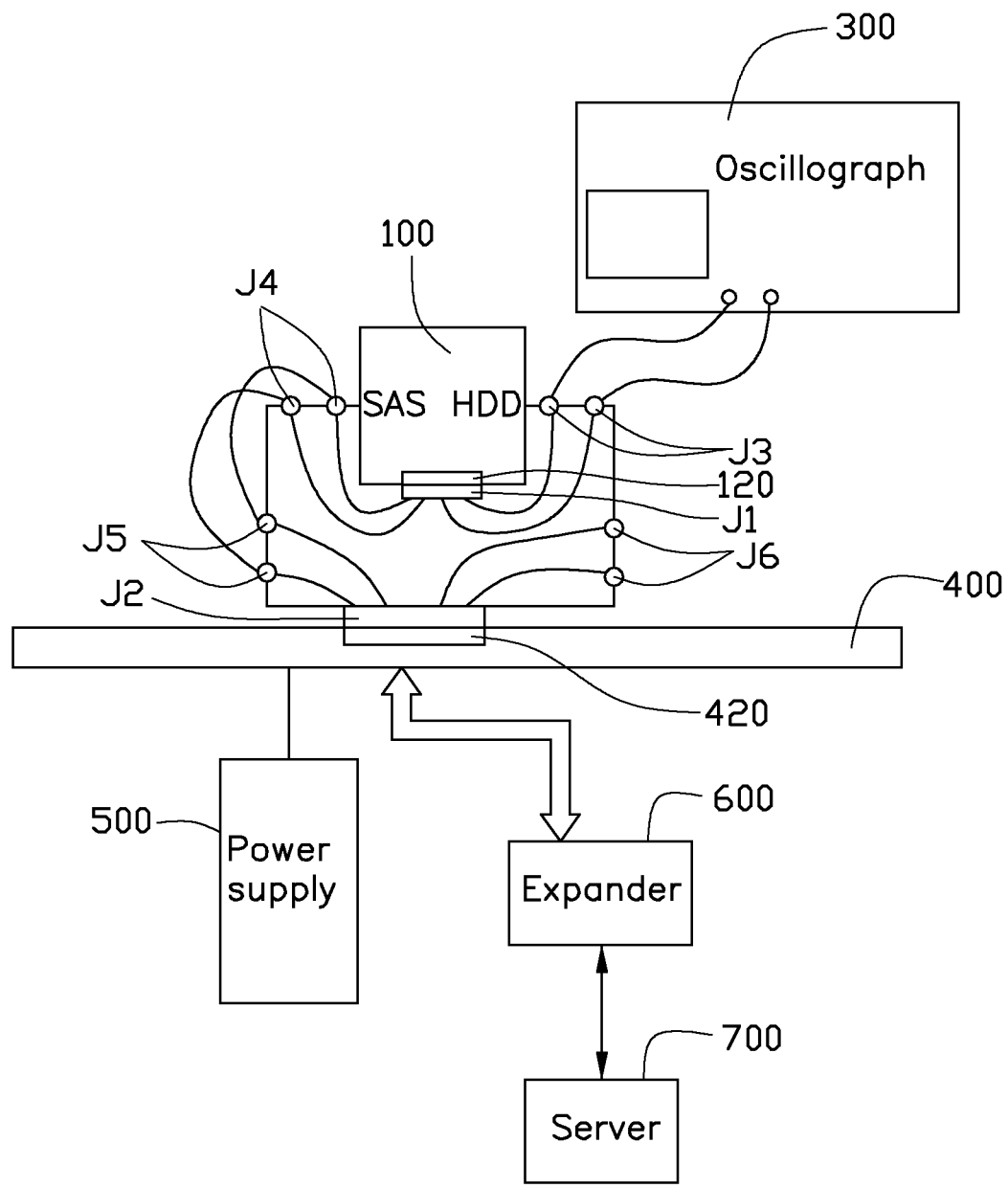
FIG. 2 is a schematic view of the signal detection apparatus of FIG. 1, showing a state of use.

Referring to FIGS. 1 and 2, an embodiment of a signal detection apparatus 800 for serial attached SCSI (SAS) devices includes a detecting board 10, an SAS female connector J1, an SAS male connector J2, first to fourth pairs of subminiature version A (SMA) connectors J3-J6. The SAS female connector J1 is mounted on a center of a surface of the detecting board 10, to be connected to an SAS male interface 120 of an SAS device, such as a hard disk drive (HDD) 100, to be tested. The SAS male connector J2 is mounted on a first side of the detecting board 10, to be connected to an SAS female interface 420 of a backboard 400 which is connected to a system, such as a server 700. The first and second pairs of SMA connectors J3 and J4 are mounted to a second side of the detecting board 10 opposite to the first side. The third and fourth pairs of SMA connectors J5 and J6 are respectively mounted to opposite ends of the detecting board 10. Herein backboard and detecting board refer to mounting surfaces on which test circuits, interfaces etc. are mounted.

The SAS female connector J1 includes a first group of data pins S1-S7, a second group of data pins S8-S14, and a group of power pins P1-P15. In one embodiment, the impedance of each of the SMA connectors J3-J6 is about 50 ohms The first group of data pins S1-S7 include a first group of ground pins S1, S4, and S7, a first group of data receiving pins S2 and S3, and a first group of data output pins S5 and S6. The second group of data pins S8-S14 includes a second group of ground pins S8, S11, and S14, a second group of data receiving pins S9 and S10, and a second group of data output pins S12 and S13.

The first group of ground pins S1, S4, and S7 and the first group of data receiving pins S2 and S3 are connected to the corresponding pins of the SAS male connector J2. The first group of data output pins S5 and S6 are connected to the first pair of SMA connectors J3. The second group of ground pins S8, S11, and S14 and the second group of data receiving pins S9 and S10 are connected to the corresponding pins of the SAS male connector J2. The second group of data output pins S12 and S13 are connected to the second pair of SMA connectors J4. Pins S51 and S61 of the SAS male connector J2, corresponding to the first group of data output pins S5 and S6, are connected to the third pair of SMA connectors J5. Pins S121 and S131 of the SAS male connector J2, corresponding to the second group of data output pins S12 and S13, are connected to the fourth pair of SMA connectors J6.

Referring to FIG. 2, in use, the SAS male interface 120 of the SAS HDD 100 is connected to the SAS female connector J1 of the detecting board 10. The SAS male connector J2 is connected to the SAS female interface 420 of the backboard 400. The first pair of SMA connectors J3 is connected to a pair of probes of an oscillograph 300. The second pair of SMA connectors J4 is electrically connected to the third pair of SMA connectors J5.

In the server 700, the backboard 400 is further connected to a plurality of power supplies 500, to supply power to the SAS HDD 100. The backboard 400 is also connected to the server 700 through an expander 600. The server 700 is used to output control signals to the SAS HDD 100 through the expander 600 and the backboard 400. It may be understood that the system also includes other elements, such as central processing units. These other elements fall within well-known technologies, and are therefore not described here.

To test the SAS interface 120 of the SAS HDD 100, the server 700 transmits control signals to the SAS HDD 100 through the expander 600, the backboard 400, the SAS male connector J2, the third pair of SMA connectors J5, the second pair of SMA connectors J4, and the second group of data pins S8-S14 of the SAS female connector J1. The SAS HDD 100 is set with some predetermined parameters, such as voltage ranges and detecting codes, by the control signals from the server 700. The first data output pins S5 and S6 of the first group of data pins S1-S7 of the SAS female connector J1 then receive a pair of output signals from the SAS HDD 100, and output the pair of output signals to the oscillograph 300 through the first pair of SMA connectors J3. Because the received output signals from the SAS HDD 100 are already set by the server 700 to satisfy impedance requirements, the detecting result read from the oscillograph 300 is accurate.

Similarly, when another pair of output signals from the SAS HDD 100 is detected, the second pair of SMA connectors J4 is connected to the oscillograph 300. The first pair of SMA connectors J3 is connected to the fourth pair of SMA connectors J6. The server 700 transmits control signals to the SAS HDD 100 through the expander 600, the backboard 400, the SAS male connector J2, the fourth pair of SMA connectors J6, the first pair of SMA connectors J3, and the first group of data pins S1-S7 of the SAS female connector J1. The second data output pins S12 and S13 of the second group of data pins S8-S14 of the SAS female connector J1 then receive the corresponding output signals from the SAS HDD 100, and output the output signals to the oscillograph 300 through the second pair of SMA connectors J4. Because the received output signals from the SAS HDD 100 are already set by the server 700 according to impedance requirements, the detecting result read from the oscillograph 300 is accurate.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A signal detection apparatus for a serial attached Small Computer System Interface (SAS) device, signal detection apparatus comprising:
   a detecting board;
   an SAS female connector mounted on the detecting board to be connected to a SAS device, the SAS female connector comprising a first group of ground pins, a first group of data receiving pins, a first group of data output pins, a second group of ground pins, a second group of data receiving pins, a second group of data output pins, and a first group of power pins;
   an SAS male connector mounted on the detecting board to be connected to a system, the SAS male connector comprising a third group of ground pins, a third group of data receiving pins, a third group of data output pins, a fourth group of ground pins, a fourth group of data receiving pins, a fourth group of data output pins, and a second group of power pins; and
   first to fourth pairs of subminiature version A (SMA) connectors mounted on the detecting board;
   wherein the first group of power pins are connected to the second group of power pins, the first group of ground pins are connected to the third group of ground pins, the first group of data receiving pins are connected to the third group of data receiving pins, the second group of ground pins are connected to the fourth group of ground pins, the second group of data receiving pins are connected to the fourth group of data receiving pins, the first group of data output pins are connected to the first pair of SMA connectors, the second group of data output pins are connected to the second pair of SMA connectors, the third group of data output pins are connected to the third pair of SMA connectors, and the fourth group of data output pins are connected to the fourth pair of SMA connectors; and
   wherein when the first pair of SMA connectors is connected to an oscillograph to detect a pair of output signals from the SAS device, the second pair of SMA connectors is connected to the third pair of SMA connectors to communicate the SAS device with the system; wherein when the second pair of SMA connectors is connected to the oscillograph to detect another pair of output signals from the SAS device, the first pair of SMA connectors is connected to the fourth pair of SMA connectors to communicate the SAS device with the system.

2. The signal detection apparatus of claim 1, wherein impedance of each of the first to fourth pairs of SMA connectors is about 50 ohms

* * * * *